United States Patent [19]

Eby

[11] Patent Number: 4,612,658
[45] Date of Patent: Sep. 16, 1986

[54] PROGRAMMABLE RIPPLE COUNTER HAVING EXCLUSIVE OR GATES

[75] Inventor: David H. Eby, Aloha, Oreg.

[73] Assignee: Tektronix, Inc., Beaverton, Oreg.

[21] Appl. No.: 584,696

[22] Filed: Feb. 29, 1984

[51] Int. Cl.[4] .................. G06M 3/02; H03K 19/21
[52] U.S. Cl. .................................... 377/52; 307/471; 377/39
[58] Field of Search ............ 377/52, 55, 107, 111, 377/116, 44, 39, 77, 54; 307/471, 272 R; 340/146.2; 328/55

[56] References Cited

U.S. PATENT DOCUMENTS

| | | | |
|---|---|---|---|
| 3,258,696 | 6/1966 | Heymann | 377/75 |
| 3,632,997 | 11/1970 | Froemke | 377/111 |
| 3,651,261 | 3/1972 | Guanella | 377/39 |
| 3,720,910 | 3/1973 | McLaughlin | 377/39 |
| 3,870,963 | 3/1975 | Groce et al. | 377/39 |
| 4,109,141 | 8/1978 | Sasaki | 340/146.2 |
| 4,392,065 | 7/1983 | Stiglich | 307/247 R |
| 4,524,345 | 6/1985 | Sybel et al. | 340/146.2 |

Primary Examiner—John S. Heyman
Assistant Examiner—Karl Ohralik
Attorney, Agent, or Firm—John P. Dellett

[57] ABSTRACT

A binary ripple counter having exclusive OR coupling elements between the counter bistables for use in a digital delay by events circuit of a display device such as an oscilloscope. The counter is programmable.

16 Claims, 2 Drawing Figures

PROGRAMMABLE RIPPLE COUNTER HAVING EXCLUSIVE OR GATES

BACKGROUND OF THE INVENTION

The present invention relates to a counter, and more particularly to an asynchronous counter having programmable input for selecting a predetermined number of events to be counted.

In horizontal deflection systems of display devices such as oscilloscopes and logic analyzers, a sweep-gating circuit generates signals which control the initiation and transit of a waveform representation being displayed. The control signals generated by the sweep-gating circuit comprise an unblanking signal and a sweep-gating signal. The sweep-gating circuit is enabled or switched from a first stable state to a second stable state in response to a trigger signal developed from a selectable source such as an internal trigger pickoff circuit or a source external to the display device. A time-base generator circuit is responsive to the sweep-gating signal to generate a ramp output voltage or sweep signal which controls the horizontal presentation of the signal being displayed. In a cathode-ray tube (CRT) oscilloscope, a horizontal amplifier receiving the ramped sweep signal applies a push-pull analog of the ramp signal to horizontal-deflection elements of the CRT, thereby moving the electron beam steadily across the screen of the CRT.

Delayed trigger signals are generated and utilized in display devices, e.g., to display a portion of a waveform or a single selected pulse from a "bit stream" or train of pulses that follows a starting event or reference signal. Such delayed trigger signals were commonly developed with analog circuits; however, with the advent of complex digital equipment having extremely long pulse trains, signal jitter became a considerable problem. If signal jitter is excessive it can exceed the time between two adjacent pulses of a bit stream being displayed, and the particular pulse or the area of interest which needs to be displayed may be displayed intermittently or not at all. To overcome this problem, display devices utilize a digital counter circuit to develop the delayed trigger signal. Conventionally the counter is of the kind which can be preset, e.g., manually, to a desired number. The counter is reset at the end of each sweep of the display. At the beginning of each sweep of the primary time-base system, the counter starts counting the number of delayed time-base trigger pulses. When the counter reaches the preset number, the delayed time-base sweep is triggered. Pulses to be displayed are thus identified by their numbered position in the train of pulses and not by the time at which they occur with respect to the starting point. It is in such preset or programmable counters where my invention finds application.

Conventional implementations of programmable counters generally utilize synchronous coupling between stages of the counter. Successive stages of synchronous counters require increasingly complex gating structures to generate logic states for input to the next succeeding state of the counter even when JK flip-flops or bistables are used to advantage. Synchronus circuits require that the various logical operations be synchronized with respect to some reference time by a sequence of reference signals or clock pulses; clock pulses must be supplied to each and every switching circuit within a synchronous logic array which is a considerable disadvantage in itself, particularly when the circuits are implemented as microelectronic elements (integrated circuits).

In view of the foregoing, it is an object of my invention to provide an improved programmable counter having asynchronous coupling between stages of the counter.

It is a further object of my invention to provide an improved programmable ripple counter utilizing exclusive OR gates.

SUMMARY OF THE INVENTION

In accordance with the present invention, I provide a programmable binary ripple counter circuit having counter stages including bistables asynchronously coupled in series through exclusive OR gates. One input of each of the XOR gates is connected to a register holding a preset number representing a number of pulses to be counted. The pulses are input serially to the first stage of the counter and counting is initialized by a timing reference signal which resets the counter bistables. A decode circuit coupled to the counter stages generates a terminal count signal when the counter has counted from the preset number up to an actual count of all ones.

While the invention is set forth with particularity in the appended claims, other objects, features and advantages of the invention will become more apparent and the invention will best be understood by referring to the following detailed description in conjunction with the accompanying drawing.

DESCRIPTION OF THE PREFERRED EMBODIMENT

Figure 1:
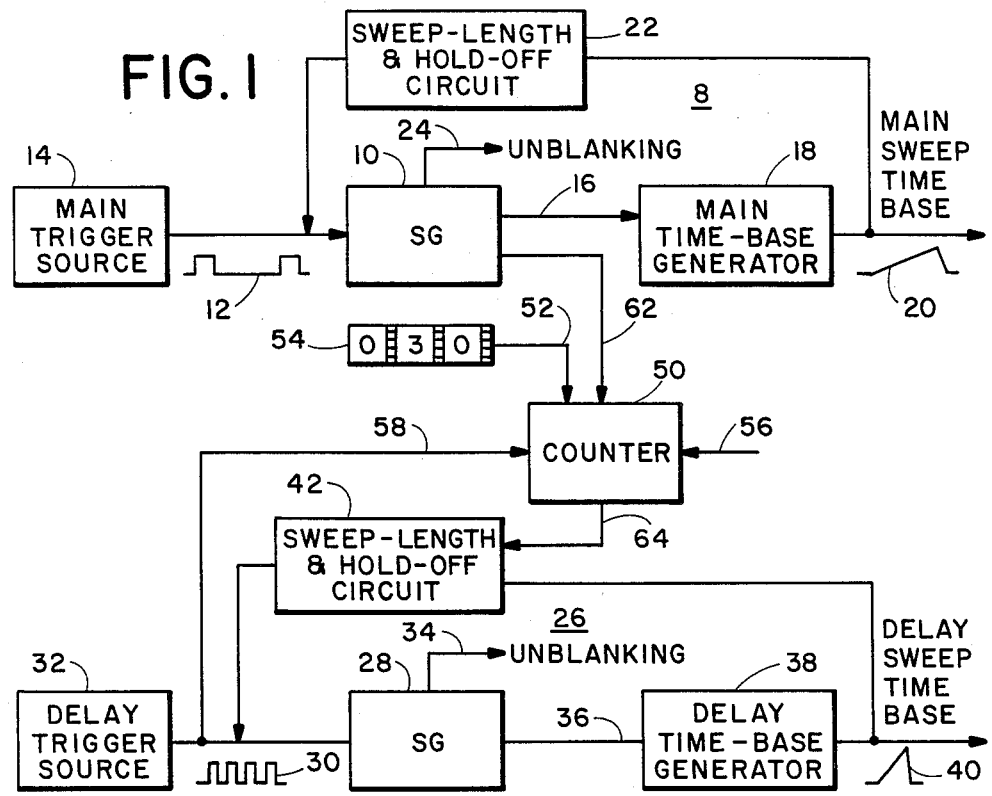
FIG. 1 is a simplified block diagram of oscilloscope circuits employing the present invention.

Referring now to the drawing for a more detailed description of the construction, operation and other features of the invention by characters of reference, FIG. 1 is a simplified block diagram of a portion of the horizontal deflection system of a display device such as an oscilloscope having circuits connected to operate in a digital delay mode. A main or primary time-base system 8 comprises a main sweep-gating circuit 10 which receives a trigger 12 from a trigger source 14. In response to the trigger signal 12, the sweep-gating circuit 10 generates a sweep-gating signal which is applied via a connection 16 to a main time-base generator circuit 18. The time-base generator circuit 18 produces a positive-going ramp output voltage 20 which serves as the main sweep time base of the display device. A sample of the ramp voltage 20 is applied via a sweep-length and hold-off circuit 22 to the input of the sweep-gating circuit 10. The sweep-gating circuit 10 generates an unblanking signal which may be coupled via a connection 24 to a control grid (not shown) of the CRT.

A delay time-base system 26 comprises a second, complete time-base system virtually identical to the main time-base system 8. A delay sweep-gating circuit 28 receives a trigger signal 30 from a delay trigger source 32. The delay sweep-gating circuit 28 generates an unblanking signal which may be coupled via a connection 34 to the control grid of the CRT. The sweep-gating circuit 28 also generates a sweep-gating signal which is applied via a connection 36 to a delay time-base generator circuit 38. The delay time-base generator circuit 38 produces a positive-going ramp output voltage 40 which serves as the delay sweep time base of the display device. A sample of the delay sweep ramp voltage 40 is coupled via a delay sweep-length and hold-off circuit 42 to the input of the delay sweep-gating circuit 28.

Figure 2:
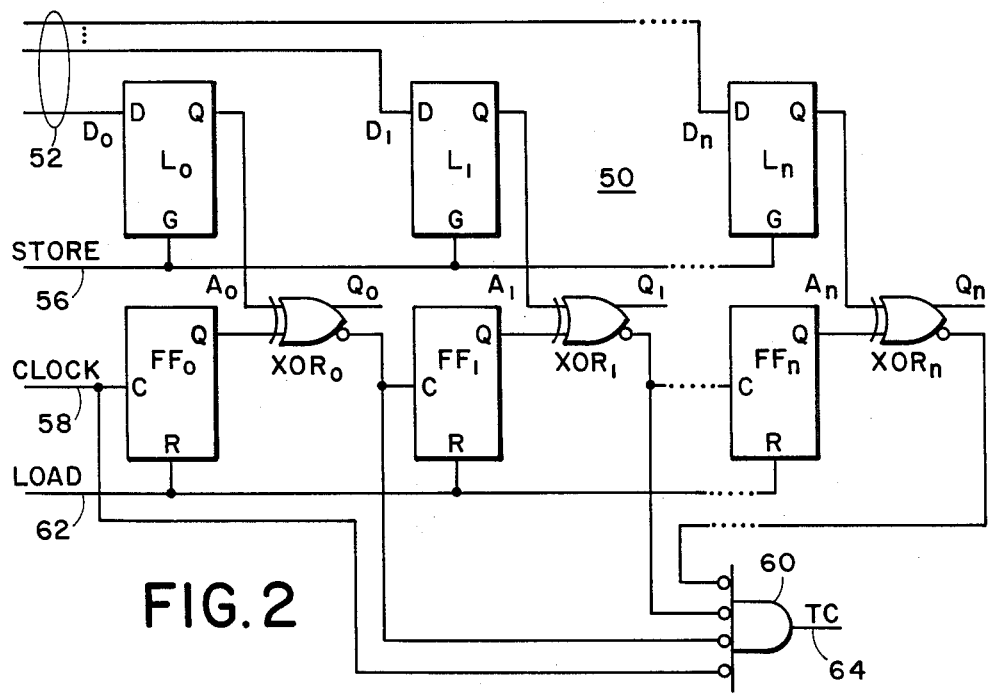
FIG. 2 is a detailed schematic of the counter of FIG. 1.

Referring now to FIG. 2 in conjunction with FIG. 1, a counter circuit 50 is connected with the main 8 and delay 26 time-base systems to facilitate operation in a digital delay mode. The counter circuit 50 receives a preset input signal-set via a bus 52 from an external signal source 54 which may be a set of manually operated switches as illustrated in FIG. 1, or a microcomputer element generating the signal-set. The counter 50 is comprised of n stages, each including a resettable toggle bistable $FF_x$ and an exclusive-OR (non-equivalence) gate or logic element $XOR_x$. Each of the XOR gates includes two input terminals and two output terminals, viz.: a true output terminal $Q_x$, and a complement output terminal designated in FIG. 2 by an inversion logic symbol. A Q output of each of the bistables $FF_x$ is connected to one input terminal of the corresponding XOR gate.

A STORE signal received by the counter 50 on a connection 56 stores the input signal-set on the bus 52 in a latch register $L_0$–$L_n$. The latch register comprises a plurality of bistables or latches corresponding on a one-to-one basis with the counter stages. The STORE signal connection 56 is coupled to a G or "gate" input of each of the latch bistables $L_0$–$L_n$. The signal-set on the bus 52 represents a binary number which is the complement of the number of pulses to be counted by the counter circuit 50, each stage of the latch register receiving one bit of the signal-set at a D input terminal of the latch. A true output Q of each of the latch register bistables $L_0$–$L_n$ is connected to the remaining input terminal of the XOR gate of the corresponding counter stage as the programming or preset number input $A_0$–$A_n$ of the counter. The $Q_x$ signal output is thus the non-equivalence of the Q output of $FF_x$ and the $A_x$ signal.

A signal to be counted is received on a connection 58 at a clock input terminal C of the first stage bistable $FF_0$ of the counter circuit 50, and in the presently described embodiment of the invention the signal to be counted is the trigger signal 30 from the delay trigger source 32. The complement output of each gate $XOR_0$–$XOR_n$ is connected as one input of a NOR or negated-AND logic 60 while the CLOCK input connection 58 is connected an another input of the NOR gate 60. The complement output of each gate $XOR_x$ is also connected to the clock input terminal C of the next stage bistable $FF_{x+1}$ of the counter 50, except of course for the last stage $XOR_n$ which is connected only to the NOR gate 60. The complement output of the $XOR_x$, when disabled or low, conditions the bistable $FF_{x+1}$ to be toggled when the next CLOCK input pulse ripples through the counter and reaches the bistable $FF_{x+1}$. An output signal TC of the NOR gate 60 represents a terminal count of the counter circuit 50. A LOAD input connection 62 couples a start-count signal to a reset R input of each of the bistables $FF_0$–$FF_n$ and is suitably provided from sweep-gate circuit 10 of FIG. 1 at the start of the gating pulse.

Programming the counter is a two-step operation. First, the latches $L_x$ are loaded with the desired preset value $D_x$ using the STORE signal. The number $D_x$ is the value to which the outputs $Q_x$ of the counter 50 are to be preset. The terminal count signal TC on a connection 64 is enabled on the falling edge of the CLOCK signal when all the outputs $Q_x$ are enabled or high; thus $D_x$ is the ones complement of the number of pulses to be counted until the terminal count signal goes high. For example, if the counter 50 is a 6-stage counter and the number of pulses to be counted is $36_8$, then latches $L_x$ are loaded with the preset value $D_x = 41_8$. After loading the latch register, the counter may be asynchronously loaded simply by pulsing the LOAD signal which resets all the bistables $FF_0$–$FF_n$ and sets $Q_x$–$A_x$. The counter chain is asynchronously clocked on the leading edge of the CLOCK signal unitl the appropriate number of CLOCKs have been counted in accordance with the contents of the latch register. The $A_x$ inputs to the XOR gates must remain valid during counting. As the CLOCK pulses are input seriatim to the bistable $FF_0$ of the counter, the $Q_0$–$Q_n$ output of the counter counts binarily from $A_x$ to the terminal count of all 1s, or $2^n - 1$, where n is the number of stages in the counter. Each CLOCK signal is propogated through the bistables $FF_x$ only so far as the logical operation of the $XOR_0$–$XOR_n$ gates permits, the complement outputs of the XOR gates toggling the $FF_1$–$FF_n$ bistables in order. The use of an exclusive OR logic gate as an element of a counter thus allows asynchronous coupling of the counter with the attendant advantage of less gating structure than synchronous counters, while facilitating a programmed or preset input to the counter.

The TC signal on a connection 64 is utilized by the display device to enable the start of the delay time-base sweep, e.g., by disabling a reset or lockout circuit in the hold-off circuit 42. The counter circuit 50 was implemented in MCA600ECL gate arrays manufactured by Motorola.

I have disclosed an asychoronous counter which utilizes exclusive-OR gates to make the counter programmable. The counter may be utilized in display devices such as oscilloscopes in a Delay By Events circuits, or in logic analyzers to count events such as instruction or logic decodes. Many modifications and variations of my invention are possible in light of the above teachings; the appended claims are intended to cover and embrace any such modifications of the invention which fall within the true spirit and scope of the invention.

I claim:
1. A counter circuit, comprising:
first register means for storing a predetermined number representing a quantity of pulses to be counted,
means for counting a series of pulses received therein from an external source, said counting means including second means for storing the counted pulses, the second storing means including means responsive to a reference timing signal received from another external source for resetting the second storing means to an initial count, said counting means including means for asynchronously coupling in series elements of the second storing means to propogate the count therethrough, the coupling means being coupled to the first mentioned storing means so as to receive the predetermined number from the first mentioned storing means, the coupling means generating a logical combination of the predetermined number and the instantaneous count stored in the second storing means, said second storing means storing a terminal count when the predetermined quantity of pulses has been counted; and means coupled to said counting means for decoding the terminal count, said decoding means including means for generating a terminal count signal for use by an external device.

2. A counter circuit, comprising:

first means for generating pulses in series to be counted;

second means for generating a reference timing signal;

register means for storing a predetermined number representing a quantity of the pulses to be counted;

means coupled in series to said first generating means for counting the pulses, said counting means including second means for storing the counted pulses, the second storing means including means responsive to the reference timing signal for resetting the second storing means to an initial count, said counting means including means for asynchronously coupling elements of the second storing means in series to propogate the count therethrough, the coupling means being coupled in parallel to said register means and receiving the predetermined number, the coupling means generating a non-equivalence of the predetermined number and the instantaneous count stored in the second storing means, said counting means storing a terminal count when the predetermined quantity of pulses has been counted;

means coupled to said counting means for decoding the terminal count; and means for utilizing a terminal count signal generated by said decoding means.

3. The counter circuit of claim 2, wherein said first generating means comprises a trigger-signal generator circuit of a display device.

4. The counter circuit of claim 2, wherein said second generating means comprises a first sweep-gating circuit of a display device.

5. The counter circuit of claim 2, wherein said utilizing means comprises a second sweep-gating circuit of a display device.

6. The counter circuit of claim 5, wherein said second generating means comprises a first sweep-gating circuit of the display device.

7. The counter circuit of claim 6, wherein said first generating means comprises a trigger-signal generator circuit of the display device.

8. A programmable ripple counter, comprising:

first means for generating pulses to be counted;

first means for storing a predetermined number representing a quantity of the pulses to be counted;

means receiving in series the pulses for counting the pulses, said counting means including at least two bistable means for storing the number of pulses counted and exclusive OR logic means for asynchronously coupling the bistable storing means in series, the exclusive OR logic means receiving in parallel from said first storing means the predetermined number representing the quantity of pulses to be counted;

means coupled to said counting means for detecting a terminal count of said counting means, said detecting means including second means for generating a terminal count signal, the terminal count signal occurring when said counting means has counted the predetermined number of pulses; and means for utilizing the terminal count signal.

9. The programmable ripple counter of claim 8, wherein said first generating means comprises a trigger-signal generator of a display device.

10. The programmable ripple counter of claim 8, wherein said utilizing means comprises a sweep-gating circuit of a display device.

11. The programmable ripple counter of claim 10, wherein said first generating means comprises a trigger-signal generator of the display device.

12. A programmable ripple counter, comprising:

a source of reference timing signals;

a source of pulses in series to be counted;

a register storing a predetermined number representing a quantity of the pulses to be counted;

a counter coupled to said register, said counter having an input stage receiving the pulses to be counted, a final stage, and intermediate stages in series with the input and final stages according to a maximum number of pulses to be counted, each of the stages including a bistable element having a trigger input, and an output, each of the stages being asynchronously coupled to an adjacent stage in the series through an exclusive OR element having a first input connected to the output of the bistable element, a second input receiving a signal representing one digit of the predetermined number, and an output, the output of the exclusive OR elements of the input and intermediate stages being connected to the trigger input of the bistable element of a succeeding one of the stages of the series, each of the bistable elements receving the reference timing signal and being reset upon occurrence thereof to initiate counting the pulses, said counter reaching a terminal count when the predetermined quantity of pulses has been counted; and a decode logic element coupled to said counter, said decode logic element generating an output signal when said counter reaches the terminal count.

13. The programmable ripple counter of claim 12, wherein said source of pulses comprises a trigger-signal generator circuit of a display device.

14. The programmable ripple counter of claim 12, wherein the predetermined count is a maximum count of the counter.

15. A programmable counter circuit, comprising:

means for storing a data item representing a number of pulses to be counted;

a counter having a plurality of stages;

means disposed between said counter stages for asynchronously coupling said counter stages in cascade relation, said coupling means comprising gating means each receiving an output from one of the plurality of stages for propagating a count through said counter, said gating means including means receiving an output from said storing means for providing a presetting input of a counter stage; and means coupled to said counter for detecting a predetermined terminal count of said counter.

16. The counter circuit of claim 14, wherein each said gating means comprises an exclusive OR logic element.

* * * * *